(12) United States Patent
Qi

(10) Patent No.: US 10,967,456 B2
(45) Date of Patent: Apr. 6, 2021

(54) APPARATUS AND METHOD FOR BONDING MASK

(71) Applicants: BOE TECHNOLOGY GROUP CO., LTD., Beijing (CN); Ordos Yuansheng Optoelectronics Co., Ltd., Inner Mongolia (CN)

(72) Inventor: Haiping Qi, Beijing (CN)

(73) Assignees: BOE TECHNOLOGY GROUP CO., LTD., Beijing (CN); ORDOS YUANSHENG OPTOELECTRONICS CO., LTD., Ordos (CN)

( * ) Notice: Subject to any disclaimer, the term of this patent is extended or adjusted under 35 U.S.C. 154(b) by 239 days.

(21) Appl. No.: 16/049,485

(22) Filed: Jul. 30, 2018

(65) Prior Publication Data
US 2019/0134741 A1    May 9, 2019

(30) Foreign Application Priority Data

Nov. 6, 2017    (CN) .......................... 201711080476.0

(51) Int. Cl.
    *B23K 20/02*    (2006.01)
    *H01L 51/00*    (2006.01)
    *B23K 20/00*    (2006.01)

(52) U.S. Cl.
    CPC ............ *B23K 20/02* (2013.01); *B23K 20/002* (2013.01); *H01L 51/0011* (2013.01)

(58) Field of Classification Search
    None
    See application file for complete search history.

(56) References Cited

U.S. PATENT DOCUMENTS

| | | | | |
|---|---|---|---|---|
| 4,971,554 A * | 11/1990 | Moore | ................... | B23K 1/012 228/19 |
| 5,993,554 A * | 11/1999 | Keicher | ............... | B23K 26/144 118/641 |
| 6,083,320 A * | 7/2000 | Lee | .................... | H01L 21/67757 118/58 |
| 9,120,123 B2 * | 9/2015 | Clark | ...................... | B23K 26/34 |
| 10,754,262 B2 * | 8/2020 | Matsumoto | ........... | H01L 21/683 |
| 2006/0266793 A1 * | 11/2006 | Bates | ........................ | B23K 1/20 228/42 |
| 2009/0081360 A1 * | 3/2009 | Fedorovskaya | ..... | H01L 51/5262 427/160 |
| 2009/0130858 A1 * | 5/2009 | Levy | ...................... | C23C 16/545 438/765 |
| 2010/0108645 A1 * | 5/2010 | Viard | ...................... | B23K 9/325 219/74 |
| 2016/0005636 A1 * | 1/2016 | Ichinose | .............. | B25J 11/0095 355/30 |
| 2016/0083845 A1 * | 3/2016 | Quinn | ...................... | C23C 14/12 257/40 |
| 2016/0184870 A1 * | 6/2016 | Miura | ............... | H01L 21/67051 134/26 |

* cited by examiner

Primary Examiner — Devang R Patel
(74) Attorney, Agent, or Firm — Thomas|Horstemeyer, LLP

(57) ABSTRACT

An apparatus for bonding a mask includes a body and a pressing unit on the body. The pressing unit has a gas outlet for spraying pressing gas toward the bonding area of the mask.

18 Claims, 2 Drawing Sheets

APPARATUS AND METHOD FOR BONDING MASK

CROSS REFERENCE

The present application claims the priority of Chinese Patent application No. 20711080476.0, filed on Nov. 6, 2017, and titled "APPARATUS AND METHOD FOR BONDING MASK", and the entire contents thereof are incorporated herein by reference as part of the present application.

TECHNICAL FIELD

The present disclosure relates to the field of organic light emitting display technology, in particular, to an apparatus and a method for bonding a mask.

BACKGROUND

At present, OLED displays have attracted more and more attention due to their advantages of low power consumption, high contrast, high color gamut, and flexible display.

The OLED display is fabricated by vapor deposition of the OLED material onto the TFT backplane according to a predetermined procedure, and formation of a red pixel unit, a green pixel unit and a blue pixel unit on the LTPS backplane with a pattern on the metal mask. In the manufacturing process of the metal mask, the metal mask needs to be welded on the metal mask receiving frame to form the mask. However, in the related art, the metal mask needs to be expanded and contracted in different directions before welding, and this is easy to cause wrinkles on the surface of the metal mask, causing gaps between the metal mask and the mask frame, in such a way that the bonding is not tight, which thus leads to cold solder during welding the metal mask and degradation of the quality of the mask.

It should be noted that the information disclosed in the background section above is only for enhancing the understanding of the background of the present disclosure, and thus may include information that does not constitute related art known to those of ordinary skill in the art.

SUMMARY

According to an aspect, an arrangement of the present disclosure provides an apparatus for bonding a mask, which includes a body and a pressing unit on the body. The pressing unit has an gas outlet for spraying pressing gas toward the bonding area of the mask.

In an exemplary arrangement, a side of the body has a plurality of the pressing units, and the gas outlets on the plurality of the pressing units are used for spraying the pressing gas toward a plurality of positions on the bonding area of the mask respectively.

In an exemplary arrangement, the pressing units are moveably connected to the body such that the gas outlets of the pressing units are capable of being close to or away from the bonding area of the mask.

In an exemplary arrangement, the pressing unit includes a fixed outlet cylinder and a movable outlet cylinder, the fixed outlet cylinder is fixed to the body, and the movable outlet cylinder is disposed in the fixed outlet cylinder. In this case, the movable outlet cylinder is in active connection with the fixed outlet cylinder, the movable outlet cylinder expands and contracts along the axis of the fixed outlet cylinder such that a first sub-outlet on the end of the movable outlet cylinder is close to or away from the bonding area of the mask, and the end of the fixed outlet cylinder has a second annular sub-outlet in which gas is sprayed along the same direction as that of the first sub-outlet.

In an exemplary arrangement, the apparatus further includes a driving portion, driving end of which is connected to the movable outlet cylinder, a detecting portion connected the driving portion, which is configured to detect flatness of bonding area between the metal mask and a mask frame, and control, according to information concerning the flatness, the driving portion to adjust a distance between the first sub-outlet and the bonding area.

In an exemplary arrangement, the gas spraying directions of the plurality of the gas outlets in which gas is sprayed are parallel to each other.

According to another aspect, an arrangement of the present disclosure provides a method for bonding a mask, which is applied to the apparatus for bonding a mask, including bonding a first bonding area of a metal mask and a second bonding area of a mask frame to each other, disposing an apparatus for bonding a mask on a side of the metal mask that is away from the mask frame, and adjusting a distance between a gas outlet on the apparatus for bonding a mask and the metal mask according to flatness of the first bonding area and the second bonding area, and spraying gas toward the first bonding area of the metal mask by the gas outlet.

In an exemplary arrangement, the gas spraying direction of the gas outlet is perpendicular to the metal mask.

In an exemplary arrangement, there is a pre-set angle between the gas spraying direction of the gas outlet and the metal mask, and the pre-set angle ranges from 45 degrees to 60 degrees.

In an exemplary arrangement, the gas outlet is configured to spray inert gas.

DETAILED DESCRIPTION

In order to further explain the technical means and functions of the present disclosure for achieving the intended purpose, the specific implementations, structures, features and functions of the apparatus for bonding a mask according to the present disclosure will be described below with reference to the accompanying drawings and preferred arrangements. The detailed description is as follows.

Figure 1:
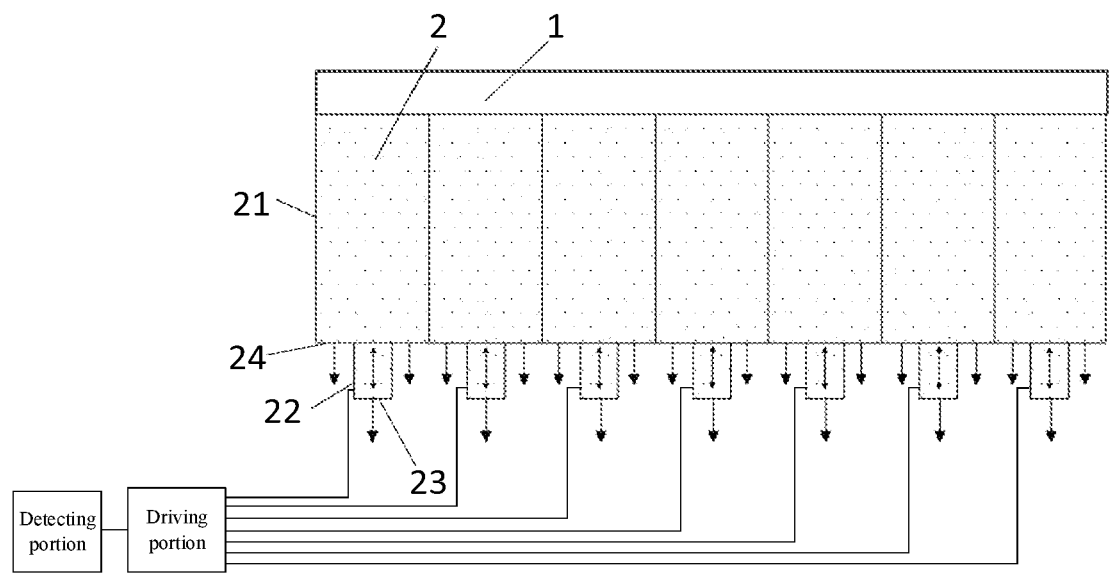
FIG. 1 is a schematic diagram illustrating a structure of an apparatus for bonding a mask according to an arrangement of the present disclosure.
Figure 2:
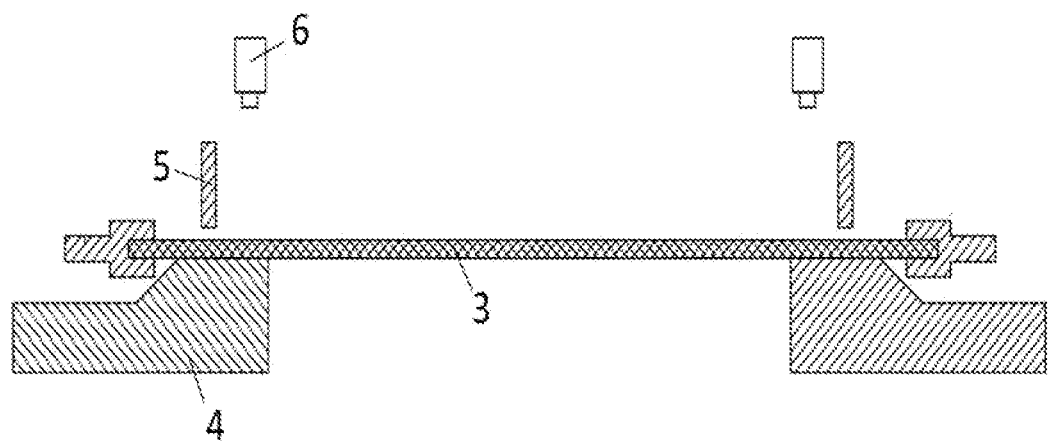
FIG. 2 is a schematic diagram illustrating a structure of a system for welding a mask according to an arrangement.

As shown in FIGS. 1 and 2, an arrangement of the present disclosure provides an apparatus 5 for bonding a mask, including a body 1 and a pressing unit 2. The pressing unit has a gas outlet for spraying pressing gas toward the bonding area of the mask.

The mask may include a metal mask 3 and a mask frame 4 and be formed by welding the metal mask 3 and the mask frame 4 on the bonding area of the mask. The body 1 may have a plurality of the pressing units 2 or have one pressing unit 2. The pressing unit 2 has an gas outlet for spraying the pressing gas. The pressing gas may be inert gas to avoid chemical reaction from being conducted for the pressing gas and the metal mask 3 or the pressing gas and the mask frame 4 during welding, and impact to the welding effect due to the chemical reaction.

Hereinafter, the apparatus for bonding a mask in the arrangement is specifically described by illustrating the operating process and principle thereof in the arrangement.

Firstly, the metal mask 3 is bonded to the mask frame 4.

Next, the pressing unit 2 is disposed on a side of the metal mask 3 that is away from the mask frame 4, such that the gas outlet of the pressing unit 2 are toward the bonding area of the metal mask 3.

Next, a distance between the gas outlet and the metal mask 3 is adjusted to be a pre-set distance.

Finally, gas is sprayed toward the bonding area of the mask by the gas outlet of the pressing unit 2, such that the metal mask 3 and the mask frame 4 are bonded more tightly, and at meanwhile, the metal mask 3 and the mask frame 4 can be welded by a welding gun 6.

Arrangements of the present disclosure provide a mask bonding apparatus for improving the tightness for bonding between a metal mask and a mask frame during welding; however, in the related art, a metal mask is required to be expanded and contracted in different directions before welding, and this is easy to cause wrinkles on the surface of the metal mask, causing gaps between the metal mask and the mask frame, in such a way that the bonding is not tight, which thus leads to cold solder during welding the mask and degradation of the quality of the mask. Compared with the related art, the apparatus for bonding a mask provided by the present disclosure includes: a body having a pressing unit thereon, the pressing unit having a gas outlet for spraying pressing gas toward the bonding area of the mask, such that, when the metal mask and the mask frame are welded, the bonding between the metal mask and the mask frame can be more tight under the gas pressure provided by spraying gas toward the metal mask through the pressing unit, and this can avoid the mask from occurrence of cold solder during welding, thus, the quality of the mask can be improved.

Further, a side of the body 1 has a plurality of pressing units 2, and the gas outlets on the plurality of the pressing units 2 are used for spraying the pressing gas toward a plurality of positions on the bonding area of the mask respectively. In this arrangement, since the pressing area on the metal mask 3 covered by the pressing gas sprayed from the single pressing unit 2 is limited, when a large area welding is required, in order to improve the welding efficiency, the body 1 may be provided with a plurality of pressing units 2 to increase the pressing area on which the apparatus for bonding a mask faces to the metal mask 3, and to improve the welding efficiency. In addition, the plurality of pressing units 2 can be evenly distributed, thus ensuring that the force may be applied to the mask 3 more uniformly, and this can ensure the bonding effect.

In order to further improve the pressing effect that the apparatus for bonding a mask applies to the mask, optionally, the pressing unit 2 is movably connected to the body 1, such that the gas outlet of the pressing unit 2 can be close to or away from the bonding area of the mask. In this arrangement, the pressure applied by the pressing unit 2 to the metal mask 3 can be adjusted by adjusting the distance between the gas outlet of the pressing unit 2 and the bonding area on the metal mask 3. Specifically, when the gas outlet on the pressing unit 2 approaches to the bonding area of the metal mask 3, the force applied by the pressing unit 2 to the metal mask 3 can be increased; when the gas outlet on the pressing unit 2 is away from the bonding area of the metal mask 3, the force applied by the pressing unit 2 to the metal mask 3 can be reduced. In this case, the pressing unit 2 and the body 1 are movably connected to each other, and such movable connection manner may be various, for example, a sliding connection or the like, which is not limited herein.

The structures of the pressing unit 2 are various. Optionally, the pressing unit 2 includes a fixed outlet cylinder 21 and a movable outlet cylinder 22. The fixed outlet cylinder 21 is fixed to the body 1, and the movable outlet cylinder 22 is disposed in the fixed outlet cylinder 21. In this case, the movable outlet cylinder 22 is connected with the fixed outlet cylinder 21 movably, the movable outlet cylinder 22 expands and contracts along the axis of the fixed outlet cylinder 21 such that a first sub-outlet 23 on the end of the movable outlet cylinder 22 is close to or away from the bonding area of the mask, and the end of the fixed outlet cylinder 21 has a second annular sub-outlet 24 in which gas is sprayed along the same direction as that of the first sub-outlet. In this arrangement, the pressing unit 2 can spray gas toward the mask through the first sub-outlet 23 and the second sub-outlet 24 to apply force to the mask and improvement of tightness for the bonding between metal mask 3 and the mask frames 4 in the mask. When the first sub-outlet 23 and the second sub-outlet 24 cover the welding area of the mask and the bonding at a certain part area of the welding area is still poor, the movable outlet cylinder 22 corresponding to the part area can be adjusted, such that the first sub-outlet 23 on the movable outlet cylinder 22 is close to the part area to increase the force applied to the part of the area, thus the bonding for the part area is improved and this ensures the quality of the mask.

Further, the apparatus 5 for bonding a mask further includes a driving portion (not shown) and a detecting portion (not shown). The driving end of the driving portion is connected to the movable outlet cylinder 22 and the detecting portion is connected to the driving portion. The detecting portion is configured to detect the flatness of the bonding area between the metal mask 3 and the mask frame 4, and according to information concerning the flatness, control the driving portion to adjust a distance between the second sub-outlet 24 and the bonding area. In the present arrangement, the detecting portion can detect the flatness of the bonding area between the metal mask 3 and the mask frame 4. When the flatness is poor, the detecting portion can control the driving portion to adjust the movable outlet cylinder 22, so as to move the first sub-outlet 23 in a direction close to the bonding area. When the flatness is good, the detecting portion can control the driving portion to adjust the movable outlet cylinder 22, so as to move the first sub-outlet 23 in a direction away from the bonding area. The detecting portion can detect the flatness of the area between the metal mask 3 and the mask frame 4, and according to the flatness, control the driving portion to adjust the distance between the first sub-outlet 23 and the bonding area, such that the apparatus for bonding a mask can apply appropriate force to the bonding area to ensure the quality of the mask.

Further, the gas spraying directions of the plurality of the gas outlets are parallel to each other. In the arrangement, since the metal mask 3 has a flat plate structure, when the gas spraying directions of the plurality of the gas outlets are parallel to each other, the force can be more uniformly applied to the metal mask 3.

Figure 3:
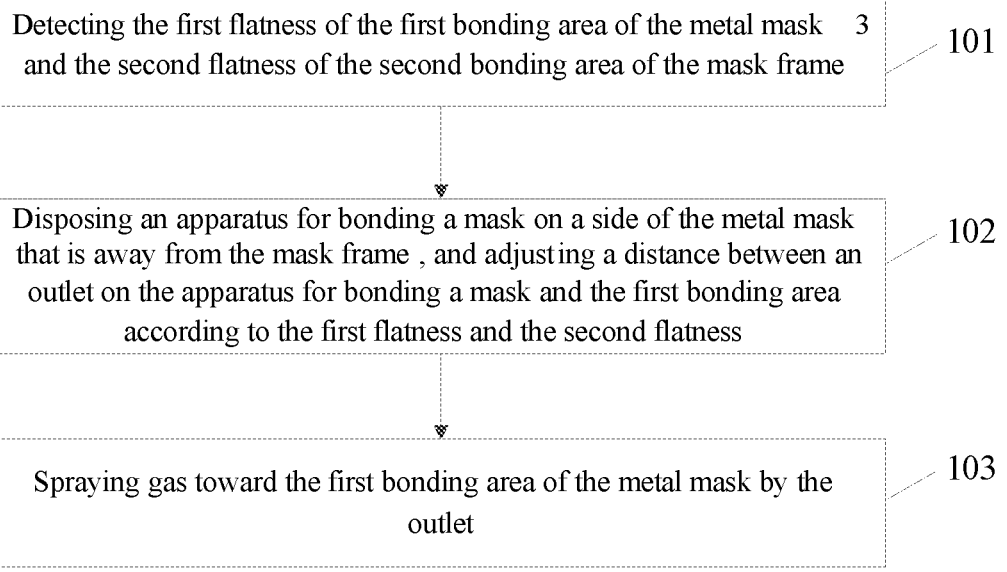
FIG. 3 is a flowchart illustrating a method for bonding a mask according to an arrangement of the present disclosure.

According to another aspect, as shown in FIG. 3, an arrangement of the present disclosure provides a method for bonding a mask as applied to the apparatus 5 for bonding a mask.

In 101: a first bonding area of a metal mask and a second bonding area of a mask frame are bonded to each other.

In this case, the mask includes a metal mask and a mask frame. While the mask is used, it is need to weld the metal mask and the mask frame. Before welding, the first bonding area of the metal mask and the second bonding area of the mask frame can be firstly bonded to each other so as to weld the first bonding area and the second bonding area later.

In 102: the apparatus for bonding a mask is disposed on a side of the metal mask that is away from the mask frame, and a distance between a gas outlet on the apparatus for bonding a mask and the metal mask is adjusted according to flatness of the first bonding area and the second bonding area.

In this case, the first flatness of the first bonding area and the second flatness of the second bonding area can determine the size of the bonding gap between the metal mask 3 and the mask frame 4. If the size of gap is too large, it is need to apply larger force to bond the metal mask 3 and the mask frame 4. If the size of gap is too small, it is need to apply smaller force to bond the metal mask 3 and the mask frame 4. The apparatus and the method for detecting flatness of the metal mask 3 and the mask frame 4 may be various, and herein, there is no limitation to it.

In addition, an apparatus 5 for bonding a mask is disposed on a side of the metal mask 3 that is away from the mask frame 4, such that when the bonding apparatus sprays gas toward the metal mask 3, force close to the mask frame 4 can be applied to the metal mask 3. Thus tightness for bonding between the metal mask 3 and the mask frame 4 can be improved. Since the force applied by spray of gas to the metal mask 3 may be adjusted by changing the distance between gas outlet and the metal mask, adjustment of the distance between the gas outlet and the metal mask according to the first flatness and the second flatness can make the apparatus 5 for bonding a mask to apply appropriate force to the metal mask 3, and this further ensures the quality of the mask.

In 103: gas is sprayed toward the first bonding area of the metal mask 3 through the gas outlet.

Arrangements of the present disclosure provide a mask bonding method for improving the tightness for bonding between a metal mask and a mask frame during welding; however, in the related art, a metal mask is required to be expanded and contracted in different directions before welding, and this is easy to cause wrinkles on the surface of the metal mask, causing gaps between the metal mask and the mask frame, in such a way that the bonding is not tight, which thus leads to cold solder during welding the mask and degradation of the quality of the mask. Compared with the related art, the method for bonding a mask provided by the present disclosure includes: firstly, bonding a first bonding area of a metal mask and a second bonding area of a mask frame to each other; then, disposing an apparatus for bonding a mask on a side of the metal mask that is away from the mask frame, and adjusting a distance between a gas outlet on the apparatus for bonding a mask and the metal mask according to flatness of the first bonding area and the second bonding area; and finally, spraying gas toward the first bonding area of the metal mask by the gas outlet. As a result, when the metal mask and the mask frame are welded, the bonding between the metal mask and the mask frame can be tighter under the gas pressure provided by spraying gas toward the metal mask through the pressing unit, and this can avoid the mask from occurrence of cold solder during welding, thus, the quality of the mask can be improved.

In an arrangement, as shown in FIG. 2, the gas spraying direction of the gas outlet is perpendicular to the metal mask 3, and this can improve the energy utilization for spray of gas by the gas outlet, thus, the force applied by the bonding apparatus to the metal mask 3 is ensured and pressing effect is improved.

Figure 4:
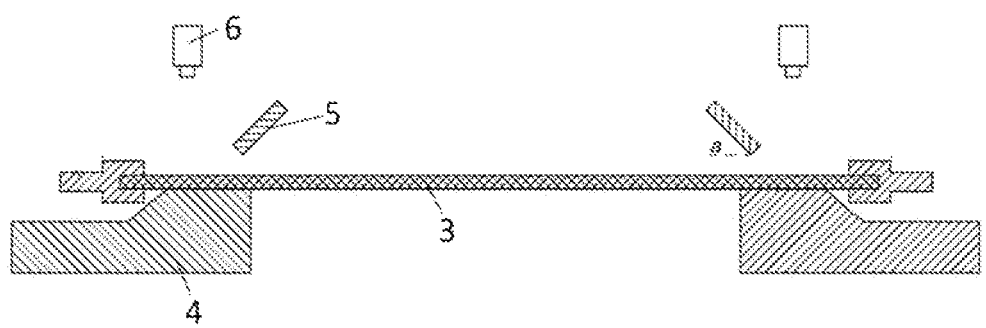
FIG. 4 is a schematic diagram illustrating a structure of a system for welding a mask according to another arrangement.

In an arrangement, as shown in FIG. 4, there is a pre-set angle between the gas spraying direction of the gas outlet and the metal mask, and the pre-set angle ranges from 45 degrees to 60 degrees. In the arrangement, since there is a pre-set angle between the gas spraying direction of the gas outlet and the welding area, it is possible to enlarge the area covered by gas spray on the one hand, and it is also possible to blow the spattering solder scraps generated during welding to the outside of the welding area on other hand, thus, the spattering solder scraps can be avoided to damage the mask during welding.

Further, the gas sprayed from the gas outlet is inert gas. The inert gas can prevent the metal mask 3 and the mask frame 4 from undergoing a chemical reaction with the pressing gas during the welding process, and the impact to the welding effect due to the chemical reaction.

The above description is merely the specific arrangement of the present disclosure, but the scope of the present disclosure is not limited thereto, and any changes or substitutions that are easy to be conceived for those skilled in the art should be covered within the protection scope of the present disclosure. Therefore, the protection scope of the present disclosure should be defined by the scope of the claims.

What is claimed is:

1. An apparatus for bonding a mask, the mask comprising a metal mask and a mask frame, the metal mask and the mask frame being welded to a bonding area of the mask, the apparatus being disposed on a side of the metal mask far away from the mask frame, the apparatus comprising:
   a body;
   a pressing unit disposed on the body, the pressing unit having a gas outlet for spraying pressing gas toward the bonding area of the mask,
   wherein the pressing unit comprises a fixed outlet cylinder and a movable outlet cylinder, the movable outlet cylinder is disposed in the fixed outlet cylinder and configured to expand and contract along an axis of the fixed outlet cylinder, and the movable outlet cylinder comprises a first sub-outlet on an end of the movable outlet cylinder;
   a driving portion, a driving end of the driving portion being connected to the movable outlet cylinder; and
   a detecting portion connected the driving portion, and configured to detect flatness of the bonding area between the metal mask and the mask frame, and control, according to information concerning the flatness, the driving portion to adjust a distance between the first sub-outlet and the bonding area.

2. The apparatus for bonding a mask according to claim 1, wherein the pressing unit is one of a plurality of pressing units disposed on a side of the body, and a respective gas outlet on each of the plurality of pressing units is configured to spray the pressing gas toward a respective one of a plurality of positions on the bonding area of the mask.

3. The apparatus for bonding a mask according to claim 2, wherein the plurality of pressing units are connected to the body moveably, and the respective gas outlet of each of the plurality of pressing units is configured to move close to or away from the bonding area of the mask.

4. The apparatus for bonding a mask according to claim 3,
wherein the first sub-outlet on the end of the movable outlet cylinder is movable to be close to or away from the bonding area of the mask, the end of the fixed outlet cylinder has a second annular sub-outlet, and a gas spraying direction of the second annular sub-outlet is same as that of the first sub-outlet.

5. The apparatus for bonding a mask according to claim 2, wherein gas spraying directions of the respective gas outlet of each of the plurality of pressing units are parallel to each other.

6. A method for bonding a mask, comprising:
bonding a first bonding area of a metal mask and a second bonding area of a mask frame to each other;
disposing an apparatus for bonding the mask on a side of the metal mask that is away from the mask frame, wherein the apparatus comprises:
a body having a pressing unit disposed on the body, the pressing unit comprising a gas outlet, a fixed outlet cylinder, and a movable outlet cylinder, wherein the movable outlet cylinder is disposed in the fixed outlet cylinder and configured to expand and contract along an axis of the fixed outlet cylinder, the movable outlet cylinder comprising a first sub-outlet on an end of the movable outlet cylinder;
a driving portion, a driving end of the driving portion being connected to the movable outlet cylinder; and
a detecting portion connected the driving portion;
detecting flatness of the first bonding area and the second bonding area using the detecting portion;
adjusting a distance between the first sub-outlet on the apparatus for bonding a mask and the metal mask according to the flatness of the first bonding area and the second bonding area; and
spraying gas toward the first bonding area of the metal mask through the gas outlet.

7. The method for bonding the mask according to claim 6, wherein a gas spraying direction of the gas outlet is perpendicular to the metal mask.

8. The method for bonding the mask according to claim 7, wherein a pre-set angle is between the gas spraying direction of the gas outlet and the metal mask, and the pre-set angle ranges from 45 degrees to 60 degrees.

9. The method for bonding the mask according to claim 8, wherein the gas outlet is configured to spray inert gas.

10. The method for bonding the mask according to claim 6, the gas outlet of the apparatus for bonding a mask is disposed on the pressing unit.

11. The method for bonding the mask according to claim 10, wherein the pressing unit is one of a plurality of pressing units disposed on a side of the body.

12. The method for bonding the mask according to claim 11, wherein the plurality of pressing units are connected with the body movably, the gas outlet of the pressing unit being configured to be close to or away from the first bonding area of the mask.

13. The method for bonding the mask according to claim 12,
wherein the first sub-outlet on the end of the movable outlet cylinder is movable to be close to or away from the bonding area of the mask, the end of the fixed outlet cylinder has a second annular sub-outlet, and a gas spraying direction of the second annular sub-outlet is same as that of the first sub-outlet.

14. A system, comprising:
a mask comprising a metal mask and a mask frame, the metal mask and the mask frame being welded to a bonding area of the mask; and
an apparatus for bonding the mask that is disposed on a side of the metal mask far away from the mask frame, wherein the apparatus comprises:
a body;
a pressing unit disposed on the body, the pressing unit having a gas outlet configured to spray pressing gas toward the bonding area of the mask, wherein the pressing unit comprises a fixed outlet cylinder fixed to the body and a movable outlet cylinder disposed in the fixed outlet cylinder and movably connected with the fixed outlet cylinder, and the movable outlet cylinder comprises a first sub-outlet on an end of the movable outlet cylinder;
wherein the movable outlet cylinder expands and contracts along an axis of the fixed outlet cylinder such that the first sub-outlet on the end of the movable outlet cylinder moves close to or away from the bonding area of the mask;
wherein the end of the fixed outlet cylinder has a second annular sub-outlet, and a gas spraying direction of the second annular sub-outlet is same as that of the first sub-outlet;
a driving portion, a driving end of the driving portion being connected to the movable outlet cylinder; and
a detecting portion connected the driving portion, and configured to detect flatness of the bonding area between the metal mask and the mask frame, and control, according to information concerning the flatness, the driving portion to adjust a distance between the first sub-outlet and the bonding area.

15. The system according to claim 14, wherein the pressing unit is one of a plurality of pressing units disposed on a side of the body.

16. The system according to claim 15, wherein a respective gas outlet on each of the plurality of pressing units is used for spraying the pressing gas toward a respective one of a plurality of positions on the bonding area of the mask.

17. The system according to claim 15, wherein the plurality of pressing units are connected to the body moveably, and a respective gas outlet of each of the plurality of pressing units is configured to move close to or away from the bonding area of the mask.

18. The system according to claim 15, wherein gas spraying directions of the respective gas outlet of each of the plurality of pressing units are parallel to each other.

* * * * *